US011956911B2

(12) United States Patent
Weber

(10) Patent No.: US 11,956,911 B2
(45) Date of Patent: Apr. 9, 2024

(54) BOTTOM PART OF ENCLOSURE FOR ELECTRICAL INSTALLATIONS

(71) Applicant: FIBOX OY AB, Espoo (FI)

(72) Inventor: Kenneth Weber, Espoo (FI)

(73) Assignee: FIBOX OY AB, Espoo (FI)

( * ) Notice: Subject to any disclaimer, the term of this patent is extended or adjusted under 35 U.S.C. 154(b) by 170 days.

(21) Appl. No.: 17/779,331

(22) PCT Filed: Nov. 24, 2020

(86) PCT No.: PCT/FI2020/050792
§ 371 (c)(1),
(2) Date: May 24, 2022

(87) PCT Pub. No.: WO2021/105559
PCT Pub. Date: Jun. 3, 2021

(65) Prior Publication Data
US 2022/0418130 A1   Dec. 29, 2022

(30) Foreign Application Priority Data

Nov. 25, 2019   (FI) ..................................... 20196013

(51) Int. Cl.
*H05K 5/02* (2006.01)
*H02B 1/44* (2006.01)
(52) U.S. Cl.
CPC ............. *H05K 5/0221* (2013.01); *H02B 1/44* (2013.01)
(58) Field of Classification Search
None
See application file for complete search history.

(56) References Cited

U.S. PATENT DOCUMENTS

| 6,121,549 | A | 9/2000 | Korhonen |
| 6,265,662 | B1 * | 7/2001 | Riedy ............... H02G 3/185 |
| | | | 174/67 |

(Continued)

FOREIGN PATENT DOCUMENTS

| CN | 206834568 | 1/2018 |
| CN | 209329482 | 8/2019 |

(Continued)

OTHER PUBLICATIONS

Jun. 1, 2023 Office Action issued in Russian Patent Application No. 2022116275/07, pp. 1-4 [machine translation included].

(Continued)

*Primary Examiner* — Xanthia C Relford
*Assistant Examiner* — Xanthia C Cunningham
(74) *Attorney, Agent, or Firm* — Nixon & Vanderhye PC

(57) ABSTRACT

The invention relates to a bottom part (1) of an enclosure, comprising a bottom (2) and a locking member to attach a cover (8) to the bottom part To allow the use of the same bottom part (1) with covers (8) of different kinds, and for the bottom part to allow the opening direction of the cover to be changed, the first wall (3) of the bottom part comprises a locking member (30*a*1) which comprises a form-locking piece (7*b*) which is detachably adapted in a recess in the first wall (3) of the bottom part (1), and a second wall of the bottom part, which is opposite to the first wall, comprises a locking member (40*a*1) which comprises a form-locking piece detachably adapted in a recess in the second wall, whereby the locking member (30*a*1) of the first wall (3) is diametrically located opposite to the locking member (40*a*1) of the second wall, and the form-locking pieces (7*b*) comprise a planar outer surface which is in the same plane as the outer surface of said walls of the bottom part to which walls the form-locking pieces are adapted, and said walls (3)

(Continued)

comprise detents which are adapted to prevent the removal of the form-locking pieces (7b) from the bottom part (1) to a direction away from the plane defined by the bottom of the bottom part (1).

16 Claims, 5 Drawing Sheets

(56) References Cited

U.S. PATENT DOCUMENTS

| | | | | |
|---|---|---|---|---|
| 6,669,041 | B2* | 12/2003 | Almond | H02G 3/383 |
| | | | | 220/3.9 |
| 7,265,292 | B2* | 9/2007 | Greenfield | H02G 3/088 |
| | | | | 174/67 |
| 7,798,540 | B1* | 9/2010 | Vitry | E05C 3/162 |
| | | | | 292/216 |
| 8,302,808 | B2* | 11/2012 | Lin | E05D 7/081 |
| | | | | 16/229 |
| 9,035,182 | B2* | 5/2015 | Scanzillo | H02G 3/088 |
| | | | | 174/67 |
| 2009/0134755 | A1* | 5/2009 | Lakoduk | H02B 1/46 |
| | | | | 29/428 |
| 2010/0072198 | A1* | 3/2010 | Roemer | H02G 3/185 |
| | | | | 220/3.3 |
| 2011/0156549 | A1* | 6/2011 | Zhang | H05K 5/0221 |
| | | | | 292/13 |
| 2016/0135315 | A1 | 5/2016 | Weber | |

FOREIGN PATENT DOCUMENTS

| | | |
|---|---|---|
| DE | 10 2017 122 190 | 3/2019 |
| EP | 1372232 | 12/2003 |
| JP | 08-110152 | 4/1996 |
| JP | 10-248121 | 9/1998 |
| JP | 2013-038508 | 2/2013 |
| JP | 2016-525861 | 8/2016 |
| JP | 2016-529697 | 9/2016 |
| JP | 2019-151392 | 9/2019 |
| RU | 2 488 930 | 7/2013 |
| RU | 2 676 670 | 9/2015 |
| WO | 2009/045468 | 4/2009 |
| WO | 2014/207318 | 12/2014 |
| WO | 2019/092304 | 5/2019 |

OTHER PUBLICATIONS

International Search Report for PCT/FI2020/050792, dated Feb. 16, 2021, 4 pages.
Written Opinion of the ISA for PCT.FI2020/050792, dated Feb. 16, 2021, 6 pages.
Search Report for FI20196013, dated Jun. 24, 2020, 1 page.
Nov. 16, 2023 Search Report issued in European Patent Application No. 20893435.6, pp. 1-5.
Jul. 11, 2023 Office Action issued in Japanese Patent Application No. 2022-530314, pp. 1-3 [machine translation included].

* cited by examiner

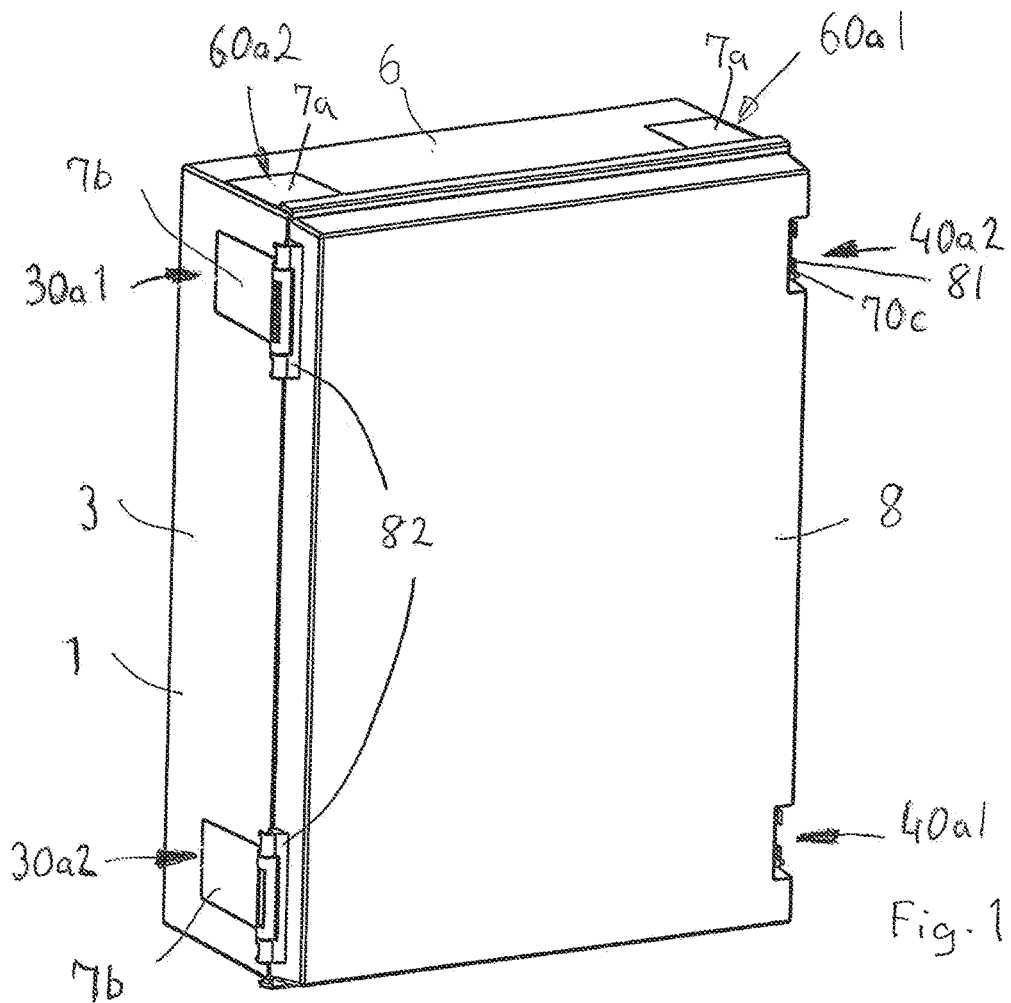
Fig. 1
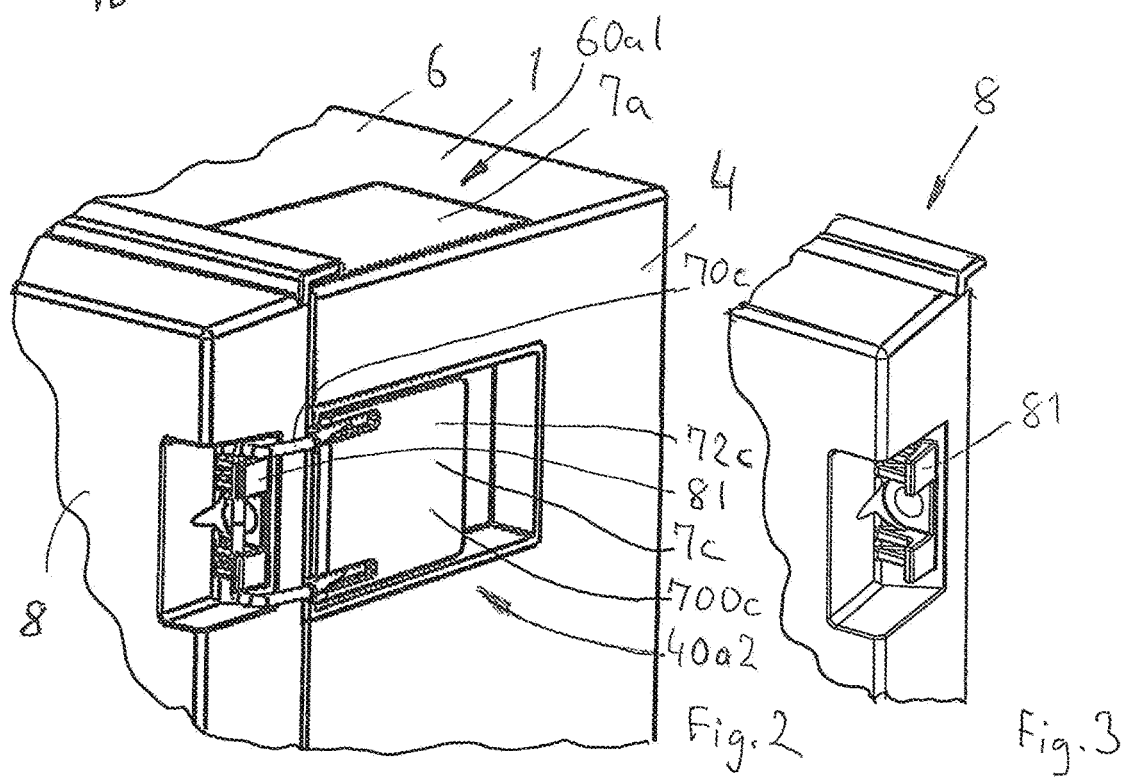
Fig. 2
Fig. 3

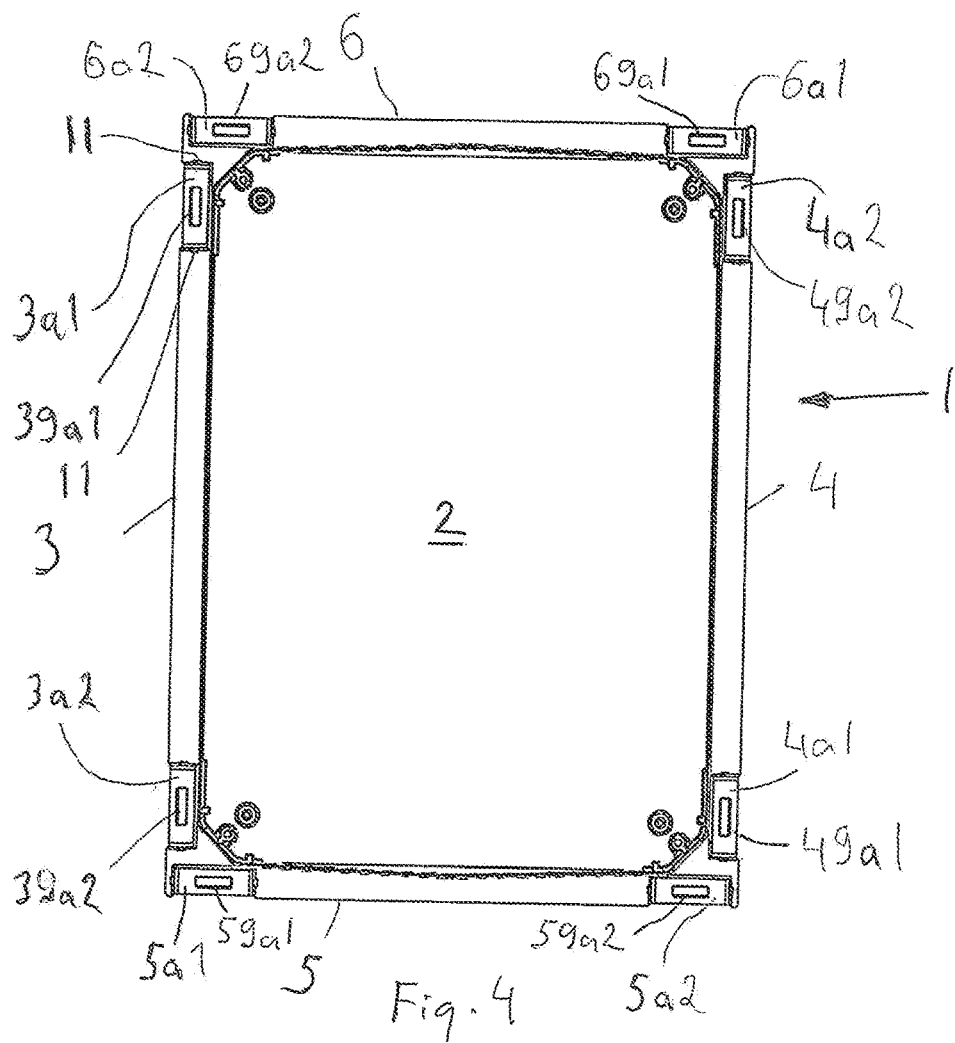
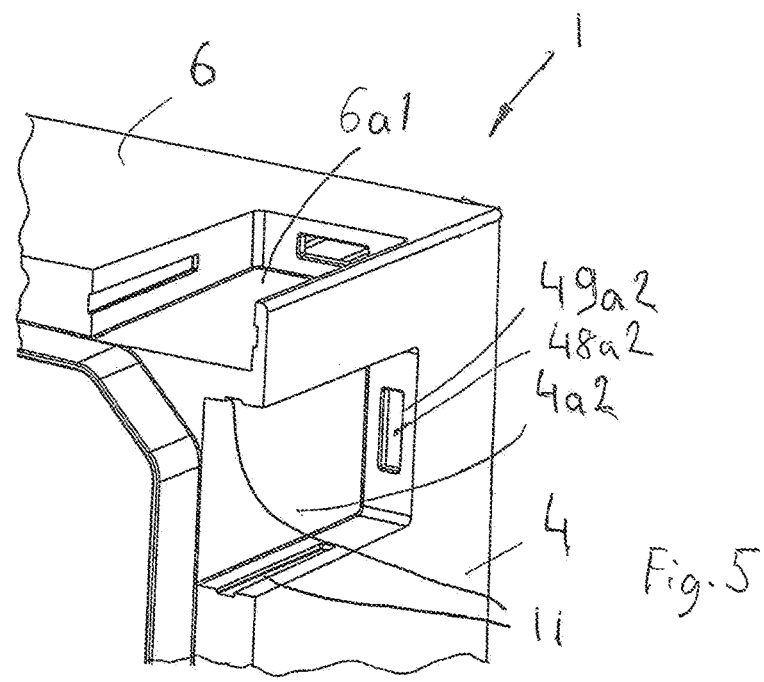

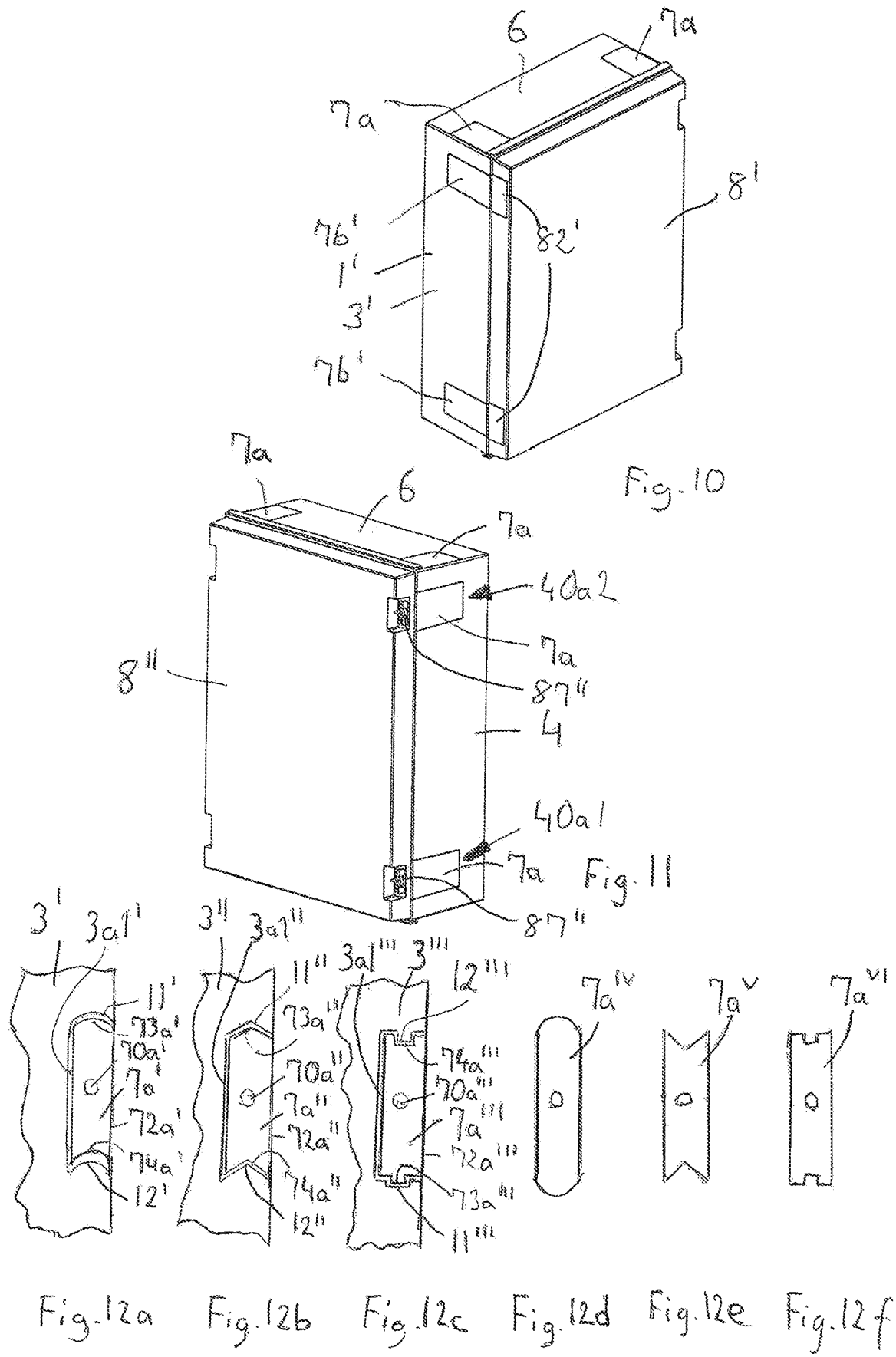

BOTTOM PART OF ENCLOSURE FOR ELECTRICAL INSTALLATIONS

This application is the U.S. national phase of International Application No. PCT/FI2020/050792 filed Nov. 24, 2020 which designated the U.S. and claims priority to FI Patent Application No. 20196013 filed Nov. 25, 2019, the entire contents of each of which are hereby incorporated by reference.

BACKGROUND OF THE INVENTION

The invention relates to a bottom part of an enclosure for electrical installations. More specifically, the invention relates to a bottom part of an enclosure for electrical installations, which comprises a rectangular bottom as well as a first wall and, opposite to the first wall, a second wall which are leading upward from the bottom, a third wall and a fourth wall opposite to the third wall, whereby the first wall of the bottom part has a first locking member to fasten a cover to the bottom part, whereby the second wall has a first locking member to fasten the cover to the bottom part.

Users of electrical enclosures, depending on the use of the electrical enclosure, have most varying requirements as well as wishes concerning what the bottom part of the electrical enclosure and also the cover of the electrical enclosure should technically be, to make the electrical enclosure as suitable as possible for its application. These requirements by the users of electrical enclosures in practice complicate the production of electrical enclosures by their manufacturers. To allow the manufacturers of electrical enclosures to deliver, with a short delivery period, electrical enclosures meeting the required/desired technical characteristics to the users, enclosure manufacturers would have to have a large quantity of pre-manufactured electrical enclosures in stock. This is very difficult and, practically-speaking, even impossible, because typically there is not enough storage space, and even if space were available, the danger exists that such a large number of electrical enclosures has been manufactured and stored that buyers cannot be found for all of them. Due to the above, buyers of electrical enclosures in practice have to wait for an electrical enclosure to be delivered, if the type of the electrical enclosure is such that one is not stocked.

BRIEF DESCRIPTION OF THE INVENTION

It is an object of the invention to provide a bottom part of an enclosure for electrical installations, the bottom part being very easily and fast greatly modifiable to meet the users' requirements and requests as concerns its technical characteristics, whereby the invention at the same time eliminates the need to have a large stock of different bottom parts for electrical enclosures. To achieve the object of the invention, the invention is characterized by what is disclosed in the characterising part of the attached claim 1.

An essential feature of the invention is that the bottom part (which is typically large) comprises a set of detachable form-locking pieces (several times smaller than the bottom part) by means of which the enclosure cover in its first position may be fastened to the bottom part, or alternatively in its second position in which the cover is rotated by 180 degrees in relation to the first position, in other words the opening direction ("handing") may be changed. Advantageously in this case, with the technical structure of the form-locking pieces, with the fastening method of the cover and the application of the electrical enclosure in mind, may additionally slightly differ from each other. The form-locking pieces do not impair the looks of the bottom part, because the form-locking pieces are adapted on recesses formed in the walls of the bottom part so that their planar outer surface is in the same plane as the outer surface of the wall of the bottom part.

The form-locking piece advantageously comprises a hinge member which allows the cover to the attached by a hinge to the desired side of the bottom part, whereby the opposite side of the bottom part has a form-locking piece which comprises a recess to fasten the cover by a screw joint to the bottom part or a handle to fasten the cover to the bottom part.

If the cover is not to be fastened with a hinge to the bottom part, the form-locking pieces of the bottom part comprise a recess to fasten the cover by a screw joint to the bottom part or a handle to fasten the cover to the bottom part.

If the opposite walls of the bottom part have more than one form-locking piece, which is advantageous as the bottom part is big, the form-locking pieces are adapted in recesses that are diametrically opposite on opposite walls of the bottom part. In such a case, the fastening means on the cover of the electrical enclosure are suitable for attaching to the desired side of the bottom part to correspond with the opening direction of the cover.

To keep the form-locking piece in place on the wall of the bottom part so that it cannot detach from the recess in the wall to the direction that is away (outward) from the outer surface defined by the wall, the recess in the wall is advantageously determined by a wall portion formed in the wall, which comprises a groove parallel to the plane defined by the wall and extends perpendicularly to the plane defined by the bottom of the bottom part, whereby the form-locking piece has a tongue which is adapted to lock the form-locking piece to the wall. Instead of a groove, the wall portion that defines the recess may advantageously have a tongue which is parallel to the plane defined by the wall and extends perpendicularly to the plane defined by the bottom of the bottom part, whereby the form-locking piece has a groove that is adapted to lock the form-locking piece to the wall so that the form-locking piece cannot detach from the recess in the wall into a direction away from the outer surface defined by the wall.

Preferred embodiments of the invention are disclosed in the attached dependent claims.

The greatest advantages of the inventive bottom part of an enclosure for electrical installations are that by utilising small-sized form-locking pieces it may easily and very fast be made suitable for receiving a cover in various ways depending on how the cover is to be fixed to the bottom part with, for example, the handing of the cover in relation to the bottom part in mind. The invention significantly reduces the need to manufacture and store a large number of different, typically large, bottom parts that require a lot of storage space. Due to the invention, customers can very quickly be provided with the desired bottom part for an electrical enclosure.

BRIEF DESCRIPTION OF THE DRAWING

The invention will now be described in closer detail with the help of exemplary descriptions by referring to the attached drawings in which:

FIG. 1 shows an electrical enclosure that comprises the inventive bottom part,

FIG. 2 is an enlarged view of a corner of the electrical enclosure of FIG. 1,

FIG. 3 shows a corner of the cover shown in FIG. 2,

FIG. 4 shows the bottom part shown in FIG. 1 without form-locking pieces and as seen directly towards the inner bottom of the bottom part, FIG. 5 is an enlarged, perspective view of the corner of the bottom part in FIG. 4, FIG. 10 illustrates a second embodiment of the inventive bottom part, FIG. 11 illustrates a third embodiment of the inventive bottom part, FIGS. 12a to 12c illustrate different variations of the inventive bottom part, and FIGS. 12d to 12f illustrate different implementations of the form-locking piece as seen from above.

DETAILED DESCRIPTION OF THE INVENTION

FIG. 1 shows an electrical enclosure comprising the inventive bottom part 1 and a cover 8 attached on it. The bottom of the bottom part 1 is rectangular, and leading upwards from it are walls 3 to 6 of the bottom part, of which walls 3 and 6, only, are seen in FIG. 1. FIG. 4 shows all the walls 3 to 6 of the bottom part 1, as seen towards the bottom 2 (inner bottom) of the bottom part.

Figure 8A:
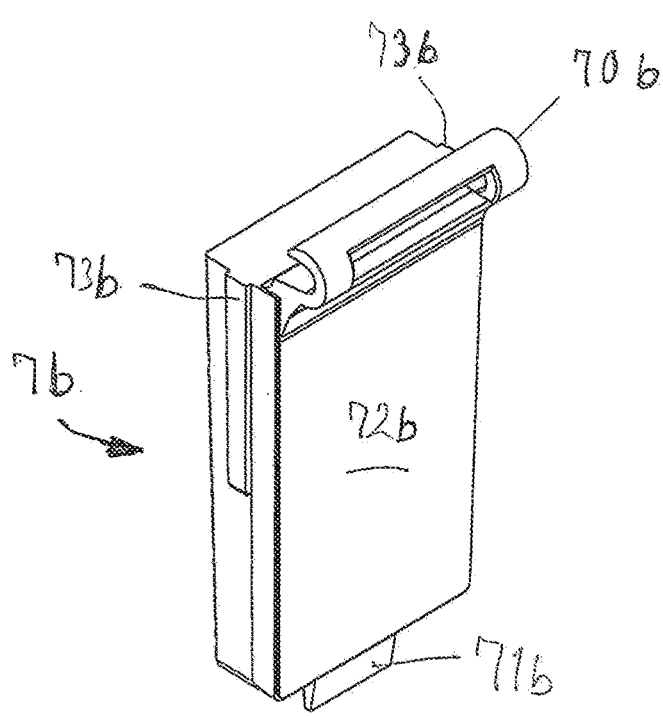
FIGS. 8a and 8b show a second implementation of the form-locking piece as a perspective view, and similarly directly from a side.
Figure 8B:
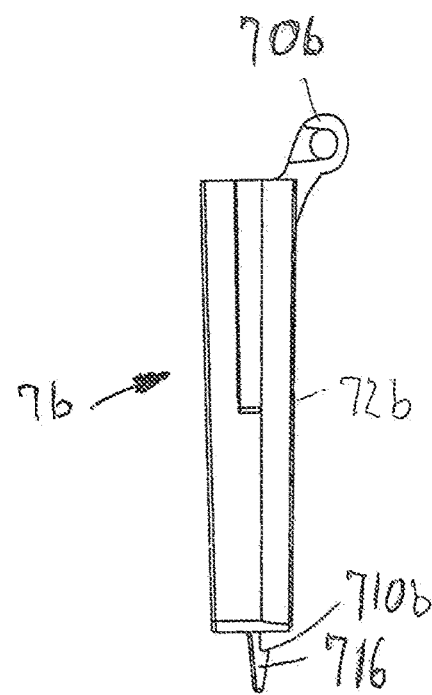

The first wall 3 of the bottom part 1 has a first locking member 30a1 and a second locking member 30a2, by means of which the cover 8 is fixed with hinges to the bottom part, see FIG. 1. The locking members 30a1 and 30a2 comprise form-locking pieces 7b whose structure is shown in FIGS. 8a and 8b. The form-locking pieces 7b are loose parts and comprise a hinge part 70b which together with a hinge part 82 formed on the cover 8 form the hinging of the cover 8.

Figure 9A:
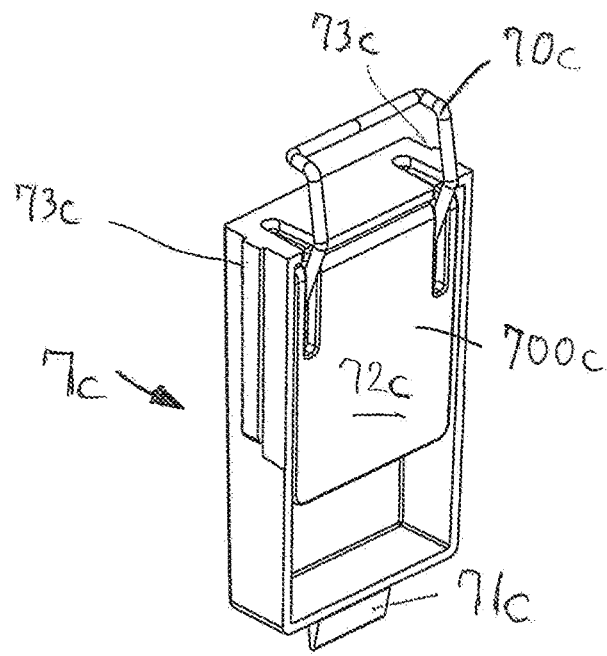
FIGS. 9a and 9b show a third embodiment of the form-locking piece as a perspective view, and similarly directly from a side.
Figure 9B:
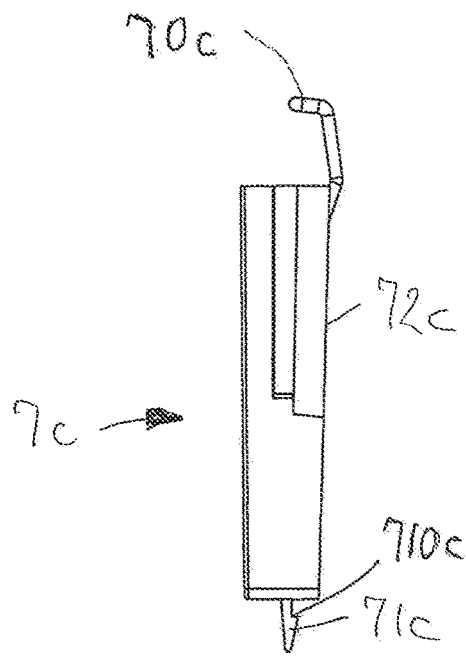

The second wall 4, opposite to the wall 3 of the bottom part 1, has a first locking member 40a1 and second locking member 40a2 to which the cover 8 is additionally fastened. The locking members 40a1, 40a2 comprise form-locking pieces whose structural details differ from the structure of the form-locking pieces 7b of the locking members 30a1, 30a2 of the wall 3. The structure of the form-locking pieces 7c on the second wall 4 is shown in FIGS. 9a and 9b: the form-locking pieces 7c comprise a handle 70c which attaches removably to a detent 81 on the cover 8, see FIG. 2. When the handle 70c co-operates with the detent piece 81 on the cover 8, the handle attaches the cover to the bottom part 1. By turning a latch 700c of the form-locking piece 7c, the handle 70 rises upwards and detaches from the detent 81 of the cover 8, thereby opening the locking. The structure and operation of the locking corresponds with the structure of handle locking, which a person skilled in the art is very familiar with, so the detailed structure of handle locking is not described in this context.

Figures 7A, 7B:
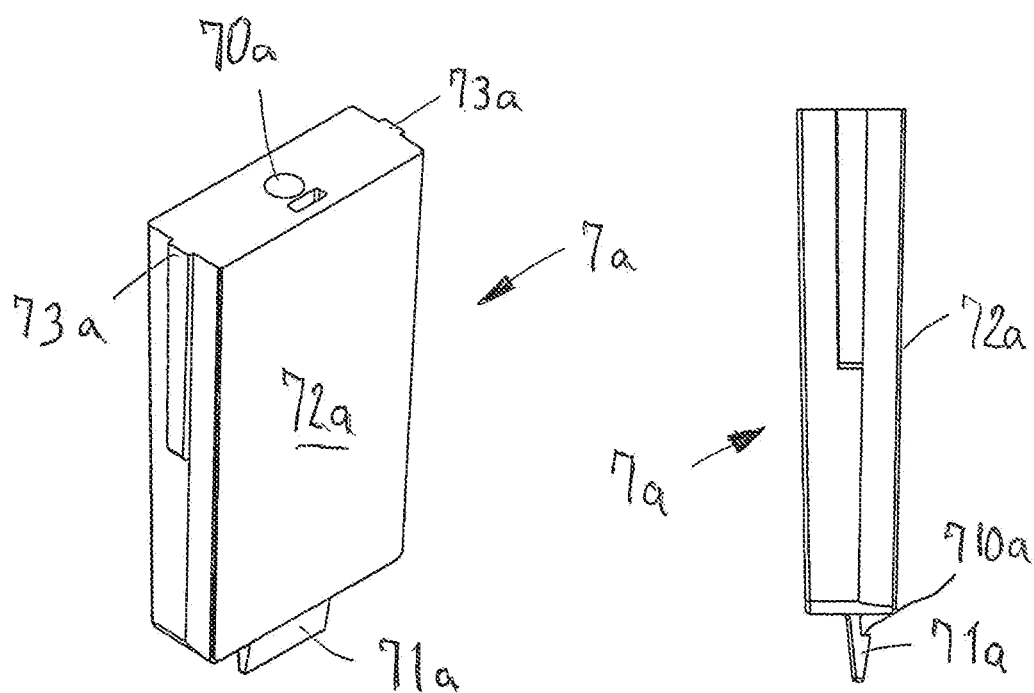
FIGS. 7a and 7b show a first implementation of the form-locking piece as a perspective view, and similarly directly from a side.

The fourth wall 6 of the bottom part 1 has a first locking member 60a1 and a second locking member 60a2, see FIG. 1. Additionally, the third wall of the bottom part 1, opposite to the fourth wall 6, similarly has two locking members but these are not shown in FIG. 1. The locking members of the third wall and fourth wall 6 comprise form-locking pieces 7a whose structure is shown in FIGS. 7a and 7b. In the enclosure of FIG. 1, the locking members of the third wall and fourth wall 6 do not act as locking members for the cover 8, because the cover is locked (fastened) to the bottom part 1 by means of the locking members 30a1, 30a2 on the first wall 3 and the locking members 40a1, 40a2 on the second wall. The purpose of the form-locking pieces 7a on the third and fourth wall 6 is to act as stiffeners, only, improving the appearance of the bottom part, which will be explained below.

The locking members 30a1, 30a2, 40a1, 40a2 on the opposite walls 3 and 4 of the bottom part 1 are diametrically placed opposite each other so that the locking member 40a1 is diametrically located opposite to the locking member 30a1 and the locking member 40a2 is diametrically located opposite to the locking member 30a2. The same applies to the locking members on the walls 5 and 6, that is, the first locking member (not shown in FIG. 1) of the wall 5 is diametrically positioned opposite to the first locking member 60a1 of the wall 6, and the second locking member (not shown in FIG. 1) of the wall 5 is diametrically located opposite to the second locking member 60a2 of the wall 6.

By means of the locking members 30a1, 30a2, 40a1, 40a2, the fastening of the cover to the bottom part 1 may be implemented in a number of ways: The cover 8 may be alternatively hinged to the wall 3 (as in FIG. 1) by means of the hinge parts 82 on the cover, or to the wall which is opposite to the wall 3. If the cover 8 is to be hinged to the bottom part 1 wall opposite to the wall 3, the form-locking pieces 7c of FIGS. 9c and 9b are adapted on the wall 3 (or the form-locking pieces 7a of FIGS. 7a and 7b), and on the wall opposite to the wall 3, the form-locking pieces 7b of FIGS. 8a and 8b are adapted.

Figure 6:
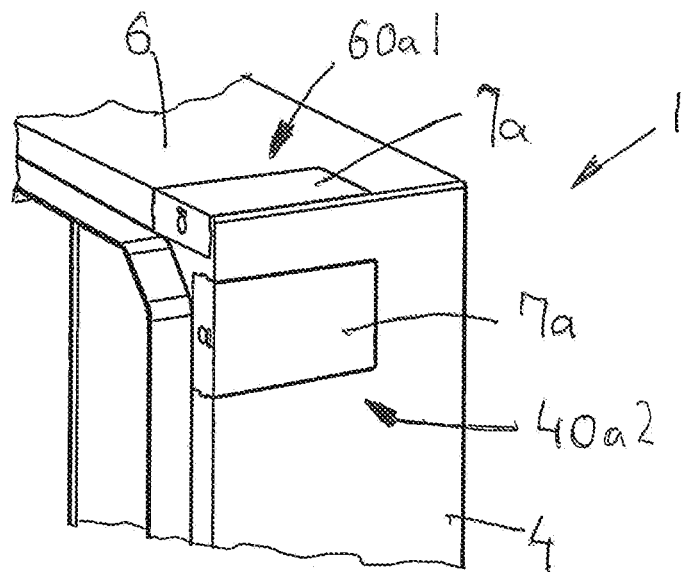
FIG. 6 shows the corner according to FIG. 4 with its form-locking pieces.

If the type of the cover 8 is such that it is to be screwed to the bottom part 1, the form-locking pieces 7a of FIGS. 7a and 7b are installed on the walls of the bottom part, cf. FIG. 6 and FIG. 11, in which the walls 4 and 6 of the bottom part have the form-locking pieces 7a of FIGS. 7a and 7b. In FIGS. 7a and 7b, the reference number 70a indicates a recess made in the form-locking piece 7a. The recess 70a receives a screw (see screw 87" in FIG. 11) by means of which the cover 8 may be fastened to the bottom part 1. The screw threads fasten to the wall portion of the recess 70a. The recess 70a may also be a through-hole, through which the screw is led, in which case a nut may be connected to the screw.

Due to the fact that different kinds of locking members/form-locking pieces may be adapted on the walls of the bottom part 1, the cover 8 may, if so desired, be fastened to the bottom part 1 in numerous ways, such as with eight handles by means of using the form-locking piece 7c of FIGS. 9a and 9b.

Irrespective of how the cover 8 is connected to the bottom part 1 and what kind of fastening members the cover has, the walls 3 to 6 of the bottom part are even without disturbing recesses or protrusions due to the form-locking pieces 7a, 7b, 7c comprising a planar outer surface 72a, 72b, or 72c, which is in the same plane as the outer surface of the wall, to which wall the for-locking piece is adapted. To allow this, formed in the walls 3 to 6 of the bottom part 1 there are recesses 3a1, 3a2, 4a1, 4a2, 5a1, 5a2, 6a1 and 6a2 to receive the form-locking pieces 7a, 7b, or 7c, see FIG. 4 which shows the bottom part 1 without form-locking pieces thereby making the recesses visible.

The form-locking pieces 7a, 7b, or 7c thus make the outer walls 3 to 6 of the bottom part 1 appear smart and uniform. In the example of FIG. 1, the form-locking pieces 7a adapted on the third and fourth wall 6 do not have the function of locking the cover 8; their purpose is, as disclosed in the above, to provide the enclosure with a presentable appearance without the recesses 5a1, 5a2, 6a1, 6a2 (cf. FIGS. 4 and 5) in the bottom part 1 impairing the appearance of the bottom part. They additionally stiffen the wall 6, just like the other form-locking pieces of the enclosure, all of which stiffen and strengthen the walls of the bottom part.

FIG. 5, showing a corner of the bottom piece 1 without form-locking pieces, discloses the structure of the recesses 4a2 and 6a1 formed in the walls of the bottom part. The structure of the other recesses (3a1, 3a2, 4a1, 5a1, 5a2, 6a2) in the bottom part 1 is similar. The recess 4a2 is defined by a wall portion formed in the wall 4 and comprising three main surfaces (bottom surface, two edge surfaces, and end surface), the wall portion comprising oppositely adapted grooves 11 (the grooves 11 on the edge surfaces) which run in parallel with the plane defined by the wall 4 and extend perpendicularly to the plane defined by the bottom 2 of the bottom part. The form-locking pieces 7a, 7b, and 7c similarly have two oppositely adapted tongues 73a, 73b, 73c, cf. FIGS. 7a, 7b, 8a, 8b, 9a, 9b. Due to the grooves 11 and tongues 73a, 73b, 73c, the form-locking pieces 7a, 7b, and 7c can be made form-lock in the recesses 4a2, 6a1, or any other recess in the bottom part 1 so that the form-locking pieces cannot detach from their corresponding walls in the direction which is away (outwards) from the outer surface defined by the walls. The form-locking described thus takes place for all the form-locking pieces of the bottom part 1. The form-locking implemented by a groove-tongue joint is preferably play-free, whereby the form-locking pieces effectively strengthen/stiffen the walls of the bottom part.

FIGS. 12a to 12c show three form-locks, differing in detail, for the form-locking pieces that allow the cover to be locked with screws. For this purpose, the form-locking pieces 7a', 7a", 7a‴ comprise a hole 70a', 70'", 70'" for a screw. FIGS. 12a to 12c use the same reference numbers as FIGS. 4, 7a, 8a and 9a for the corresponding parts. The form-locking pieces 7a', 7a" and 7a‴ are locked in a recess 3a1', 3a1", 3a1‴ formed in the wall 3', 3", 3‴ of the bottom part. As illustrated in FIGS. 12a to 12c, the form of the tongues 73a', 73a", 73a‴ of the form-locking pieces 7a', 7a", 7a‴ may vary to a great extent. FIGS. 12a to 12c additionally illustrate that the form-locking pieces 7a', 7a", 7a‴ may, instead of tongues, have grooves 74a', 74a" and 74a‴ to lock the form-locking piece by form-locking into a tongue 12', 12", 12‴ in the wall 3', 3", 3‴ of the bottom part. As understood from FIGS. 12a to 12c, the form of the grooves 74a', 74a" and 74a‴ may greatly differ, and a number of non-illustrated forms are possible.

Differing from FIGS. 12a to 12c, the form-locking piece may comprise a groove on both of its opposite edges, which is illustrated by form-locking pieces $7a^V$ and $7a^{VI}$ shown in FIGS. 12e and 12f, in which case the recess made in the wall of the bottom part naturally has to have tongues to receive the grooves.

The forms of the form-locking pieces 7a', 7a", 7a‴, $7a^{IV}$, $7a^V$ and $7a^{VI}$ of FIGS. 12a to 12f may equally be used for form-locking pieces having such a type that they provide a hinge locking instead of screw fastening, cf. FIGS. 8a and 8b, or handle locking, cf. FIGS. 9a, 9b.

In summary, with regard to the form-locking pieces and their form, it may generally be said that they are loose pieces, and to achieve form-locking there may be a tongue and groove on their opposite edges, and the recesses of the bottom part 1 may have a groove or tongue. To make the bottom part with its form-locking pieces practical to manufacture and to use, all the recesses of the bottom part are similar, and the forms of all the form-locking pieces are similar whereby any form-locking piece—regardless of whether it produces a screw, hinge, or handle fastening—may be adapted in any recess of the bottom part.

In FIGS. 4 and 5, the reference number 49a2 denotes a detent formed in the recess 4a formed in the wall 3. The other walls of the bottom part 1 have similar detents 39a1, 39a2, 59a1, 59a2, 69a1, 69a2. These detents 39a1, 39a2, 49a1, 49a2, 59a1, 59a2, 69a1, 69a2 are collars formed of the through-holes 48a2, see FIG. 5, formed in the recesses of the walls 3 to 6. The purpose of the detents 39a1, 39a2, 49a1, 49a', 59a1, 59a2, 69a1, 69a2 is to prevent the non-desired moving of the form-locking pieces 7a to 7c in the direction of the planes defined by the walls 3 to 6 of the bottom part 1 away from the bottom of the bottom part and off the recesses 3a1, 3a2, 4a1, 4a2, 5a1, 5a2, 6a1, 6a2. For this purpose, there is stopper member 71a, 71b, and 71c at the end of the form-locking pieces 7a to 7c, which abuts the bottom 2 of the bottom part, cf. FIGS. 7a, 7b, 8a, 8b, 9a, 9b, the stopper member locking into the detents 39a1, 39a2, 49a1, 49a2, 59a1, 59a2, 69a1, 69a2. The stopper member 71a, 71b and 71c is formed by a flexible tab in which is formed a collar 710a, 710b, 710c, see FIGS. 7b, 8b, and 9b. When a form-locking piece, such as the form-locking piece 7c of FIG. 9b, is inserted in a recess, such as the recess 49a2 of FIG. 5, its stopper member 71c contacts the wall of the hole 48a in the recess, whereby the stopper member yields in the lateral direction; and when insertion continues, the collar 710c of the stopper member 71c sets against the collar of the hole 48a2, locking the form-locking piece 7c in the recess 49a2. When the form-locking piece 7c is to be removed from the recess, lateral force is exerted on its stopper member 71c by means of a screwdriver, for example, whereby the stopper member yields so that its collar 710c is released from the collar of the hole 48a, and the form-locking piece 7c may be pulled out of the recess 49a2.

The purpose of FIG. 10 is to show that the form-locking piece 7b', by means of which the cover 8' is locked with a hinge to the bottom part 11', may be formed such that also its hinge part does not protrude from the plane defined by the outer surface of the enclosure side 3'. The hinge part 82' on the cover 8' is similarly formed such that it does not protrude from the enclosure.

The bottom part according to the invention is recommendably made of plastic. The plastic used may recommendably be ABS plastic (acrylonitrile butadiene styrene) or PC plastic (polycarbonate). Alternatively, the bottom part may be made of metal. The form-locking pieces, too, are recommendably made of plastic. If a form-locking piece comprises a handle, it is of metal.

In the above, the invention is described by means of examples, wherefore it is noted that the details of the invention may be implemented in various ways within the scope of the attached claims. Therefore the number and form of the recesses and form-locking pieces in the bottom part may vary. At minimum, the bottom part 1 of the enclosure has two recesses which are formed in opposite walls of the bottom part and in which form-locking pieces are adapted. By forming at least one set of recesses and form-locking pieces in all the walls of the bottom part, the fastening of the cover to the bottom part of the enclosure is made possible in very varying ways either by hinging it on any wall of the bottom part or by fastening the cover to the bottom part by form-locking pieces to which the cover attaches with screws and/or form-locking pieces which comprise a handle for attaching the cover to the enclosure. It is conceivable that the form-locking of the form-locking pieces is established with one groove-and-tongue type joint, only, the position of which on the wall portion defined by the recess may vary. The detents (cf. e.g. detent 49a2 in FIG. 5) formed in the recesses of the bottom part, by means of which the moving of the form-locking parts is prevented away (upwards) from the bottom of the bottom part so that it detaches from the bottom part, may be formed of the wall portion of the recess in the bottom part, against which the upper end of the form-locking piece, so the end having the recess, hinge part, or handle (cf. recess 70a in FIG. 7a, hinge part 70b in FIG. 8a, or handle 70c in FIG. 9a) stops and rests when the form-locking piece is being pushed away (upwards) from the bottom of the bottom part. In the solution last referred to, the form-locking piece is adapted in place in the recess of the bottom part from the side of the bottom of the bottom part, that is, in the opposite direction to the one in the above examples in which the form-locking piece is adapted in place in the recess of the bottom part by pushing it towards the bottom of the bottom part, that is, from above. As indicated by the exemplary description of the invention with its drawings, the external form of the form-locking pieces may vary to a large extent, but nevertheless establishing a form lock.

The invention claimed is:

1. A bottom part of an enclosure for electrical installations, which comprises a rectangular bottom as well as a first wall and, opposite to the first wall, a second wall which are leading upward from the bottom, a third wall and a fourth wall opposite to the third wall, whereby the first wall of the bottom part has a first locking member to fasten a cover to the bottom part, whereby the second wall has a first locking member to fasten the cover to the bottom part, wherein the first locking member of the first wall comprises a first form-locking piece which is detachably adapted in a first recess formed in an outer surface of the first wall of the bottom part whereby the first form-locking piece adapted in the first recess comprises a planar outer surface which is in the same plane as the outer surface of the first wall, and a first detent formed in the first wall, adapted to prevent the removal of the first form-locking piece adapted in the first recess from the bottom part to a direction away from the plane defined by the bottom of the bottom part when a stopper member of the first form-locking piece is adapted for cooperation with the first detent, the first locking member of the second wall comprises a second form-locking piece which is detachably adapted in a first recess formed in an outer surface of the second wall whereby the second form-locking piece adapted in the first recess of the second wall comprises a planar outer surface which is in the same plane as the outer surface of the second wall, and a first detent formed in the second wall, adapted to prevent the removal of the second form-locking piece adapted in the first recess of the second wall from the bottom part to a direction away from the plane defined by the bottom of the bottom part when a stopper member of the second form-locking piece is adapted for cooperation with the first detent formed in the second wall, and the first locking member of the first wall is diametrically located opposite to the first locking member of the second wall.

2. A bottom part of an enclosure as claimed in claim 1, wherein the first form-locking piece comprises a hinge part to fasten the cover by a hinge to the bottom part.

3. A bottom part of an enclosure as claimed in claim 1, wherein the first form-locking piece comprises a recess to fasten the cover by a screw joint to the bottom part.

4. A bottom part of an enclosure as claimed in claim 2, wherein the second form-locking piece comprises a recess to fasten the cover by a screw joint to the bottom part, or a handle to fasten the cover to the bottom part.

5. A bottom part of an enclosure as claimed in claim 1, wherein the first and second form-locking piece comprise a handle to fasten the cover to the bottom part.

6. A bottom part of an enclosure as claimed in claim 1, wherein the first locking member of the first wall and the first locking member of the second wall are located in the middle of the first wall and second wall.

7. A bottom part of an enclosure as claimed in claim 1, wherein the first recess of the first wall is similar to the first recess of the second wall so that the form-locking piece of the first wall is adaptable to the first recess of the second wall.

8. A bottom part of an enclosure as claimed in claim 1, wherein the third wall comprises a first locking member which comprises a first form-locking piece which is detachably adapted in a first recess formed in an outer surface of the third wall, and the fourth wall comprises a first locking member which comprises a first form-locking piece detachably adapted in the first recess formed in the outer surface of the fourth wall, whereby the first locking member of the third wall is diametrically located opposite to the first locking member in the fourth wall.

9. A bottom part of an enclosure as claimed in claim 8, wherein the first locking member of the third wall and the first locking member of the fourth wall are located in the middle of the third wall and fourth wall.

10. A bottom part of an enclosure as claimed in claim 1, wherein in addition to the first locking member the first wall has a second locking member which comprises a second form-locking piece which is detachably adapted in a second recess formed in an outer surface of the first wall, and in that in addition to the first locking member the second wall has a second locking member which comprises a second form-locking piece detachably adapted in a second recess formed in the outer surface of the second wall, whereby the second locking member of the first wall is diametrically located opposite to the second locking member of the second wall.

11. A bottom part of an enclosure as claimed in claim 10, wherein the third wall comprises a first locking member which comprises a first form-locking piece which is detachably adapted in a first recess formed in an outer surface of the third wall, and the fourth wall comprises a first locking member which comprises a first form-locking piece removably adapted in a first recess formed in the outer surface of the fourth wall, whereby the first locking member of the third wall is diametrically located opposite to the first locking member of the fourth wall.

12. A bottom part of an enclosure as claimed in claim 10, wherein the third wall comprises a first locking member which comprises a first form-locking piece which is detachably adapted in a first recess formed in an outer surface of the third wall, and a second locking member which comprises a second form-locking piece detachably adapted in a second recess formed in the outer surface of the third wall, and in that the fourth wall comprises a first locking member which comprises a first form-locking piece detachably adapted in a first recess formed in the outer surface of the fourth wall, and a second locking member which comprises a second form-locking piece detachably adapted in a second recess formed in the outer surface of the fourth wall, whereby the first locking member of the third wall is diametrically located opposite to the first locking member of the fourth wall, and the second locking member of the third wall is diametrically located opposite to the second locking member of the fourth wall.

13. A bottom part of an enclosure as claimed in claim 8, wherein the recesses formed in all the walls of the bottom part are similar so that the form-locking piece of the first wall is adaptable in the recess of any wall of the bottom part.

14. A bottom part of an enclosure as claimed in claim 1, wherein the first recess is defined by a wall portion formed in the first wall, which comprises a groove which is parallel to the plane defined by the first wall and extends perpendicularly to a plane defined by the bottom of the bottom part, whereby the first form-locking piece has a tongue which is adapted to lock the first form-locking piece to the first wall so that the detachment of the first form-locking piece from the first wall is prevented in a direction which is away from the outer surface defined by the first wall.

15. A bottom part of an enclosure as claimed in claim 1, wherein the first recess is defined by a wall portion formed in the first wall, which comprises a tongue which is parallel to the plane defined by the first wall and extends perpendicularly to the plane defined by the bottom of the bottom part, whereby the first form-locking piece has a groove which is adapted to lock the first form-locking piece to the first wall so that the detachment of the first form-locking piece from the first wall is prevented in the direction which is away from the outer surface defined by the first wall.

16. A bottom part of an enclosure as claimed in claim 1, wherein the first detent formed in the first wall comprises a collar, and in that the stopper member of the form-locking piece comprises a flexible tab which comprises a collar which is adapted to lock a form-locking piece to said first detent whereby the form-locking piece is detachable from the bottom part by applying a force on the flexible tab so that the flexible tab passes said first detent whereby the locking of the form-locking piece is released.

\* \* \* \* \*